US012021146B2

(12) United States Patent
Shin et al.

(10) Patent No.: US 12,021,146 B2
(45) Date of Patent: Jun. 25, 2024

(54) SEMICONDUCTOR DEVICES

(71) Applicant: Samsung Electronics Co., Ltd., Suwon-si (KR)

(72) Inventors: Hongsik Shin, Seoul (KR); Wonhyuk Lee, Incheon (KR); Dongkwon Kim, Suwon-si (KR); Jinwook Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 315 days.

(21) Appl. No.: 17/529,406

(22) Filed: Nov. 18, 2021

(65) Prior Publication Data
US 2022/0254928 A1 Aug. 11, 2022

(30) Foreign Application Priority Data

Feb. 5, 2021 (KR) ........................ 10-2021-0016547

(51) Int. Cl.
*H01L 29/78* (2006.01)
*H01L 27/088* (2006.01)
*H01L 29/08* (2006.01)

(52) U.S. Cl.
CPC ...... *H01L 29/7851* (2013.01); *H01L 27/0886* (2013.01); *H01L 29/0847* (2013.01)

(58) Field of Classification Search
CPC ..... H01L 21/823431; H01L 21/823821; H01L 21/845; H01L 27/0886; H01L 27/0924; H01L 27/1211; H01L 29/41791; H01L 29/66795; H01L 29/785; H01L 29/7851; H01L 29/7853; H01L 29/7855; H01L 2029/7858
See application file for complete search history.

(56) References Cited

U.S. PATENT DOCUMENTS

| 9,379,025 | B1 | 6/2016 | Basker et al. |
| 10,269,906 | B2 | 4/2019 | Li |
| 10,388,791 | B2 | 8/2019 | Kim et al. |
| 10,468,300 | B2 | 11/2019 | Xie et al. |
| 2006/0024874 | A1 | 2/2006 | Yun et al. |
| 2019/0273023 | A1 | 9/2019 | Loh et al. |
| 2020/0091011 | A1* | 3/2020 | Khaderbad ..... H01L 21/823871 |
| 2020/0212035 | A1 | 7/2020 | Jung et al. |
| 2020/0243519 | A1 | 7/2020 | Yu et al. |
| 2020/0312847 | A1* | 10/2020 | Ching ............... H01L 29/41791 |

FOREIGN PATENT DOCUMENTS

KR 10-2006-0011320 A 2/2006

* cited by examiner

*Primary Examiner* — David C Spalla
(74) *Attorney, Agent, or Firm* — Myers Bigel, P.A.

(57) ABSTRACT

Semiconductor devices may include a substrate, an active region that is on the substrate and extends in a first direction, a gate structure that traverses the active region and extends in a second direction that may be different from the first direction, a source/drain region on the active region adjacent a side of the gate structure, an insulating layer on the substrate, the gate structure and the source/drain region, and a contact structure that is in the insulating layer and is connected to the source/drain region. In the source/drain region, a contact region that is in contact with the contact structure includes first and second side regions spaced apart from each other in the second direction and a central region between the first and second side regions, and at least one of the first and second side regions may include a recess.

15 Claims, 16 Drawing Sheets

SEMICONDUCTOR DEVICES

CROSS-REFERENCE TO RELATED APPLICATION(S)

This application claims priority under 35 U.S.C. § 119 to Korean Patent Application No. 10-2021-0016547 filed on Feb. 5, 2021 in the Korean Intellectual Property Office, the entire disclosure of which is incorporated herein by reference in its entirety.

BACKGROUND

The present inventive concept relates to a semiconductor device.

While demand for high performance, high speed and/or multifunctionality in semiconductor devices is increasing, demand for a greater degree of integration in semiconductor devices is also increasing. In order to meet the demand for high integration of semiconductor devices, the development of semiconductor devices having a three-dimensional channel structure is actively progressing.

SUMMARY

Example embodiments provide highly integrated semiconductor devices.

According to example embodiments, semiconductor devices may include a substrate, at least one active region (e.g., at least one active region having a fin shape) disposed on the substrate and extending in (e.g., extending longitudinally in) a first direction, a gate structure traversing the at least one active region and extending in a second direction that may be different from (e.g., may be perpendicular to) the first direction, a source/drain region disposed on the at least one active region adjacent a side of the gate structure, an insulating layer disposed on the substrate and on (e.g., covering) the gate structure and the source/drain region, and a contact structure in (e.g., penetrating through) the insulating layer and connected (e.g., directly connected) to the source/drain region. In the source/drain region, a contact region in contact with the contact structure includes first and second side regions spaced apart from each other in the second direction and a central region between the first and second side regions, and at least one of the first and second side regions may include a recess.

According to example embodiments, semiconductor devices may include a substrate, an active region (e.g., a fin-type active region) on the substrate extending in (e.g., extending longitudinally in) a first direction, a plurality of channel layers spaced apart from each other in a vertical direction that is perpendicular to an upper surface of the substrate, on the active region, a gate structure disposed on the substrate to traverse the plurality of channel layers, extending in a second direction that may be different from (e.g., may be perpendicular to) the first direction and surrounding the plurality of channel layers, a source/drain region disposed on the active region adjacent a side of the gate structure, and connected (e.g., directly connected) to the plurality of channel layers, an insulating layer disposed on the substrate and on (e.g., covering) the gate structure and the source/drain region, and a contact structure in (e.g., penetrating through) the insulating layer and connected (e.g., directly connected) to the source/drain region. An upper surface of the source/drain region may include a stepped surface that is contacted by the contact structure and includes a lower step and an upper step, and the source/drain region includes opposing ends spaced apart from each other in the second direction, and the lower step is adjacent a first end of the opposing ends of the source/drain region.

According to example embodiments, semiconductor devices may include a substrate, two first active fins and a second active fin on the substrate, which extend in (e.g., extend longitudinally in) a first direction and are spaced apart from each other in a second direction that may be different from (e.g., may be perpendicular to) the first direction, a gate structure disposed to traverse the two first active fins and the second active fin and extending in (e.g., extending longitudinally in) the second direction, two first source/drain regions disposed on the two first active fins, respectively, adjacent a side of the gate structure, a second source/drain region disposed on the second active fin adjacent the side of the gate structure, an insulating layer disposed on the substrate and on (e.g., covering) the gate structure and the first and second source/drain regions, a first contact structure in (e.g., penetrating through) the insulating layer and connected (e.g., directly connected) while traversing the two first source/drain regions, and a second contact structure in (e.g., penetrating through) the insulating layer and connected (e.g., directly connected) to the second source/drain region. A first one of the two first source/drain regions, a second one of the two first source/drain regions, and the second source/drain region are sequentially arranged along the second direction. Each of the two first source/drain regions includes first and second side regions spaced apart from each other in the second direction, and the first side region of one of the two first source/drain regions is closer to the second source/drain region than the second side region of the one of the two first source/drain regions. The second side region of the first one of the two first active fins includes a first recess, and the first side region of the second one of the two first active fins includes a second recess. End portions of the first contact structure in the second direction are in the first and second recesses, respectively.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described in detail with reference to the accompanying drawings.

Figure 1:
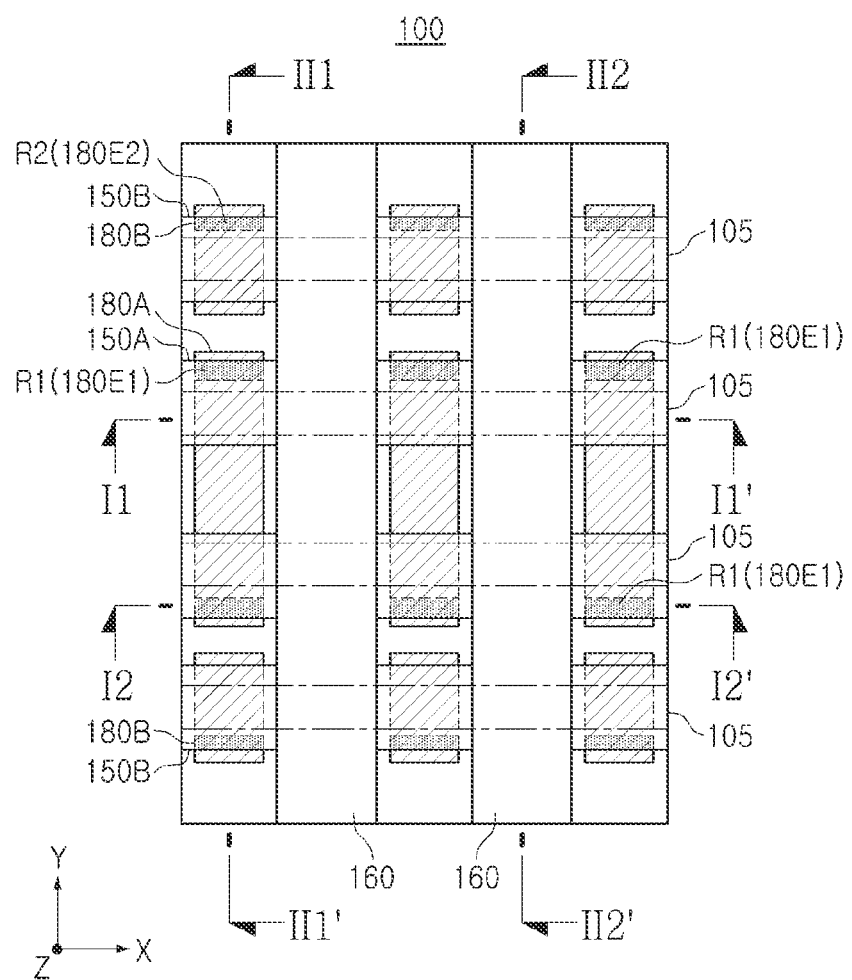
FIG. 1 is a plan view illustrating a semiconductor device according to an example embodiment of the present inventive concept.
Figure 2A:
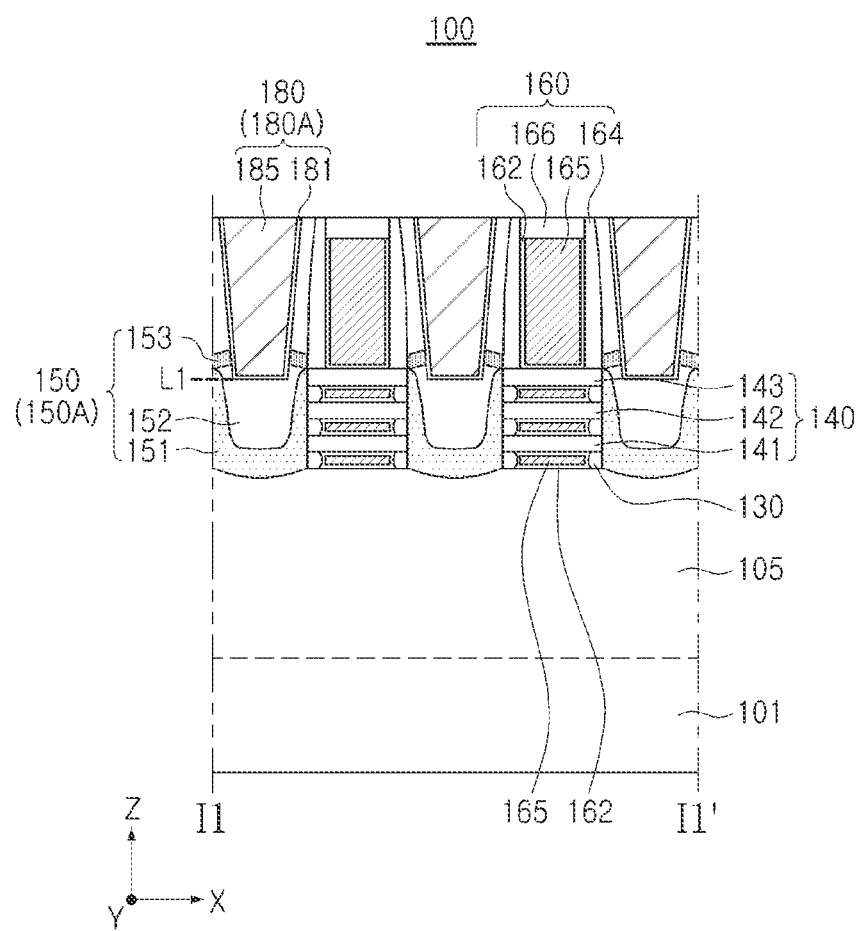
FIGS. 2A and 2B are cross-sectional views of the semiconductor device of FIG. 1, taken along lines I1-I1' and I2-I2'.
Figure 2B:
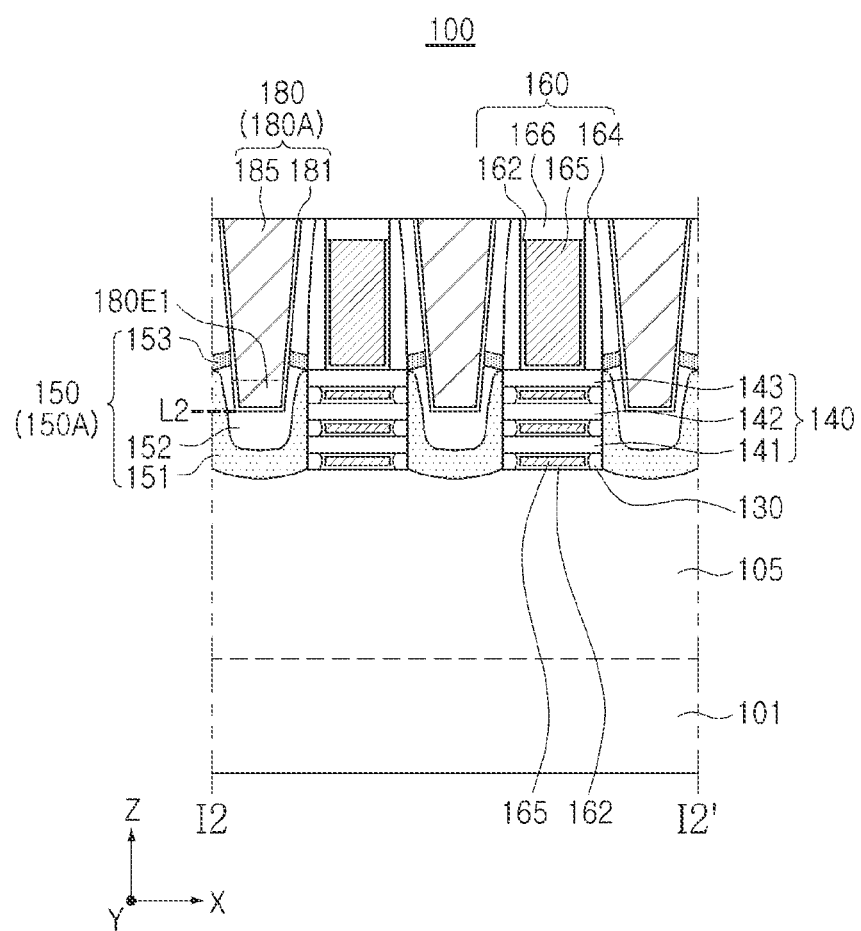
Figure 3A:
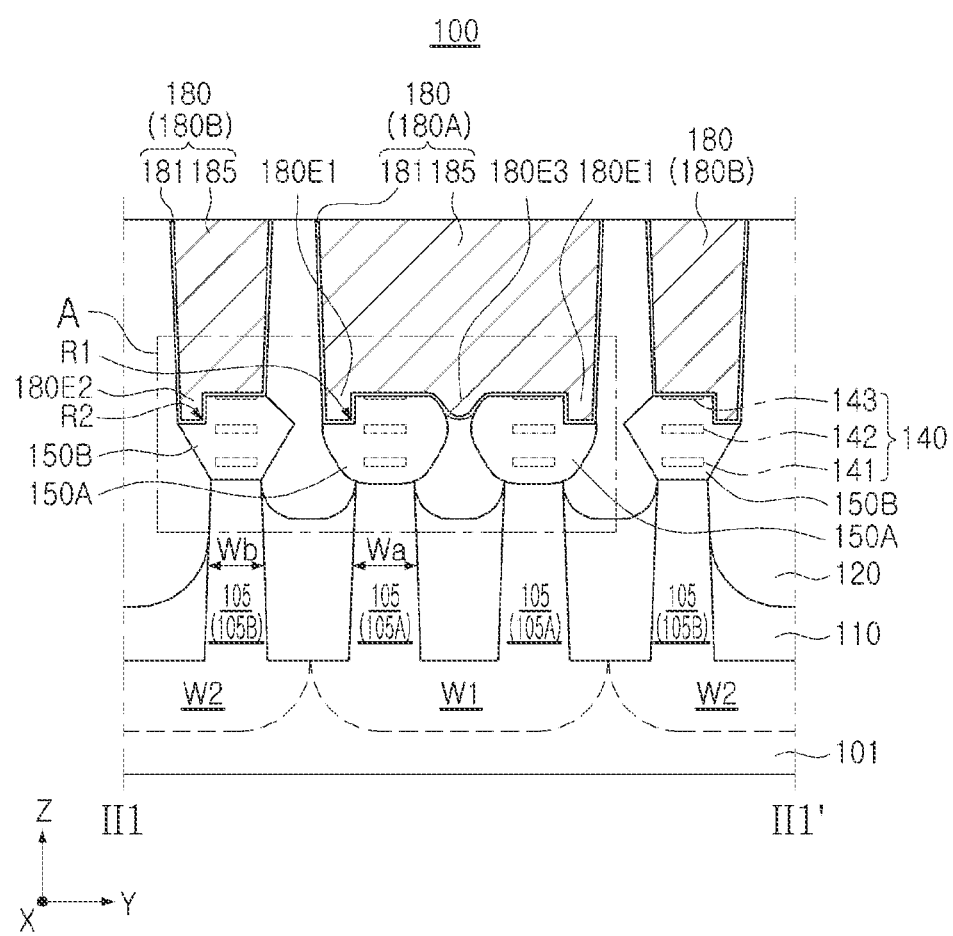
FIGS. 3A and 3B are cross-sectional views of the semiconductor device of FIG. 1, taken along lines II1-II1' and II2-II2'.
Figure 3B:
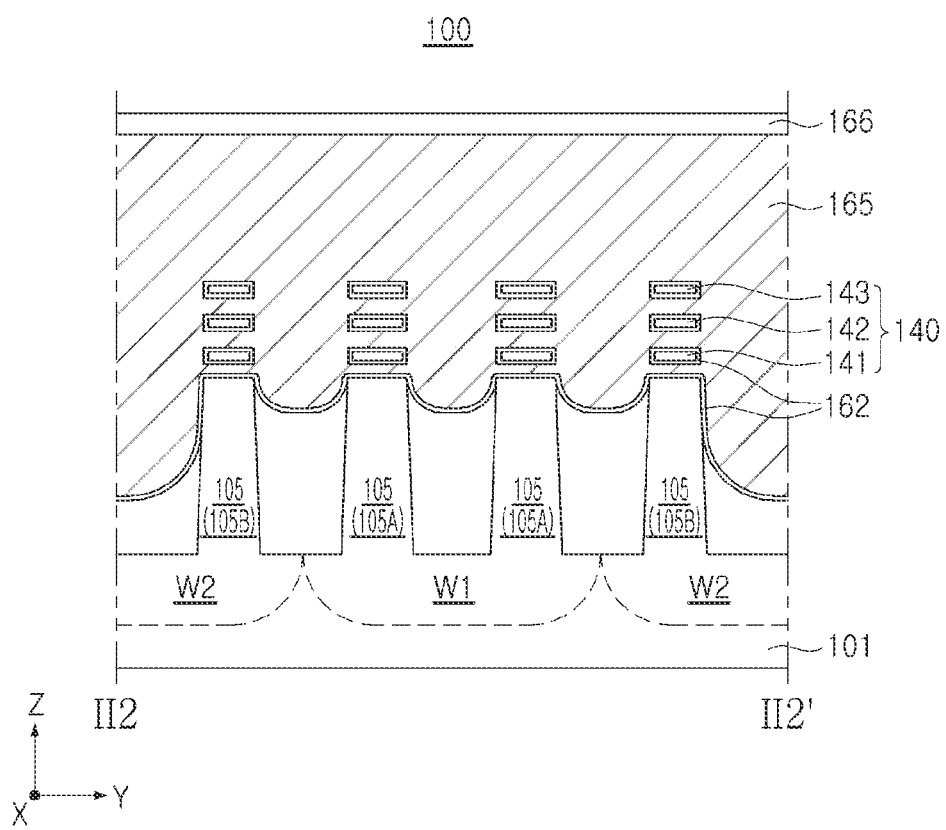

FIG. 1 is a plan view illustrating a semiconductor device according to an example embodiment of the present inventive concept, and FIGS. 2A and 2B are cross-sectional views of the semiconductor device of FIG. 1, taken along lines I1-I1' and I2-I2', and FIG. 3A and FIG. 3B are cross-sectional views of the semiconductor device of FIG. 1, taken along lines II1-II1' and II2-II2'.

Referring to FIGS. 1 and 2A and 2B, a semiconductor device 100 according to an example embodiment of the present inventive concept may include a substrate 101, a plurality of active fins 105 extending in a first direction (e.g., an X direction) on the substrate 101 and arranged in a second direction (e.g., a Y direction) intersecting the first direction, a plurality of channel structures 140 disposed on the plurality of active fins 105, respectively, a gate structure 160 extending in the second direction while traversing plurality of active fins 105, and source/drain regions 150 disposed on opposing sides of the gate structure 160, respectively, and in contact with a plurality of channel layers 141, 142 and 143. In addition, the semiconductor device 100 may include a device isolation film (e.g., a device isolation film 110 in FIG. 3A), an interlayer insulating layer (e.g., an interlayer insulating layer 120 in FIG. 3A), and contact plugs 180 penetrating through the interlayer insulating layer and connected to the source/drain regions 150. As used herein, "an element A extends in a direction W" (or similar language) means that the element A extends longitudinally in the direction W.

The semiconductor device 100 employed in this embodiment may include a gate-all-around type electric field effect transistor comprised of channel structures 140, source/drain regions 150, and gate structures 160.

Referring to FIGS. 3A and 3B, each of the plurality of active fins 105 has a protruding structure extending in the first direction (e.g., the X direction). For example, the substrate 101 may be a semiconductor substrate such as a silicon substrate or a germanium substrate, or a silicon-on-insulator (SOI) substrate. The device isolation film 110 may define the plurality of active fins 105. For example, the device isolation film 110 may include an oxide layer, a nitride layer, or a combination thereof. The device isolation film 110 may define the plurality of active fins 105 on the substrate 101. The device isolation film 110 may be disposed on the substrate 101 to cover side surfaces of the plurality of active fins 105 of the substrate 101. The device isolation film 110 may be formed to expose upper regions of the plurality of active fins 105. The device isolation film 110 may have a curved upper surface having a higher level adjacent to the plurality of active fins 105. As used herein, "a surface C is higher than a surface D" (or similar language) means that the surface D is closer than the surface C to a substrate.

In this embodiment, the substrate 101 may include first and second well regions W1 and W2 doped with first and second conductivity type impurities. The plurality of active fins 105 may include first and second active fins 105A and 105B disposed in the first and second well regions W1 and W2, respectively. For example, the first well region W1 may be a p-type well for an NMOS transistor, and the second well region W2 may be an n-type well for a PMOS transistor.

In this embodiment, two first active fins 105A are disposed adjacent to each other, and one second active fin 105B may be disposed on both sides of the first active fin 105A in the second direction, respectively. The first and second active fins 105A and 105B may be provided as active regions for a PMOS transistor and an NMOS transistor, respectively. The width of the first active fin 105A may be the same as or different from the width of the second active fin 105B. In some embodiments (refer to FIG. 3A), the first active fin 105A may have a width Wa greater than a width Wb of the second active fin 105B.

Referring to FIGS. 2A and 2B, a plurality of channel structures 140 may include a plurality of channel layers 141, 142 and 143 disposed on each of the active fins 105 and spaced apart from each other in a direction perpendicular to the upper surface of the substrate 100 (e.g., in the Z direction). The direction perpendicular to the upper surface of the substrate 100 may be referred to as a vertical direction.

A gate structure 160 may include a gate electrode 165 extending in the second direction (e.g., Y direction) and surrounding the plurality of channel layers 141, 142, and 143, a gate dielectric layer 162 disposed between the gate electrode 165 and the plurality of channel layers 141, 142 and 143, gate spacers 164 disposed on the side surfaces of the gate electrode 165, and a gate capping layer 166 disposed on the gate electrode 165. In detail, the channel structure 140 may include first to third channel layers 141, 142 and 143 spaced apart from each other in a direction (e.g., Z direction) perpendicular to the upper surface of the substrate 101, on the active fin 105.

The first to third channel layers 141, 142, and 143 may have a width equal to or similar to a width of the active fin 105 in the second direction (e.g., Y direction), and may have a width equal to or similar to a width of the gate structure 160 in the first direction (e.g., X direction). This configuration is not limited thereto, and in some embodiments, the widths of the first to third channel layers 141, 142, and 143 may be slightly different. For example, the width of the first channel layer 141 may be greater than the width of the second channel layer 142. In addition, in some embodiments, in the cross-sectional view taken along the first direction (e.g., X direction), the widths of the first to third channel layers 141, 142 and 143 may be less than the width of the gate structure 160, in such a manner that side surfaces of the first to third channel layers 141, 142 and 143 are located below the gate structure 160.

The source/drain regions 150 may be disposed on the active fin 105, on opposing sides of the channel structure 140 in the first direction, respectively, as described above. Opposing sides of the first to third channel layers 141, 142 and 143 in the first direction (e.g., X direction) may respectively contact the source/drain regions 150. The source/drain region 150 may form a recess in a partial region of the active fin 105 and may include an epitaxial layer selectively grown in the recessed region.

In this embodiment, the source/drain regions 150 may include a first source/drain region 150A disposed on the first active fin 105A, and a second source/drain region 150B disposed on the second active fin 105B. For example, the first and second source/drain regions 150A and 150B may each include Si, SiGe, or Ge, and may have different materials and/or different shapes.

In some embodiments, in the case of an NMOS transistor, the first source/drain region 150A includes silicon, and may be doped with N-type impurities (e.g., phosphorus (P), nitrogen (N), arsenic (As), and/or antimony (Sb)). The cross section (refer to FIG. 3A) of the first source/drain region 150A may have a hexagonal shape or a polygonal shape having a gentle angle. In the case of a PMOS transistor, the second source/drain region 150B may include silicon-germanium (SiGe) and may be doped with P-type impurities (e.g., boron (B), indium (In), and/or gallium (Ga)). A cross section (refer to FIG. 3A) of the first source/drain region 150B may have a pentagonal shape. In some embodiments, the first source/drain region 150A may be slightly larger than the second source/drain region 150B.

As illustrated in FIG. 3A, a first contact structure 180A may be disposed to traverse two first source/drain regions 150A, and on the second source-drain regions 150B disposed on both sides thereof, second contact structures 180B may be respectively disposed.

The first and second source/drain regions 150A and 150B have contact regions in contact with the first and second contact structures 180A and 180B, respectively. Each of the contact regions of the first and second source/drain regions 150A and 150B may have first and second side regions spaced apart from each other in the second direction (e.g., Y direction), and a central region between the first and second side regions. At least one of the first and second side regions may have a portion (e.g., R1 or R2) further recessed than the central region. The portions R1 and R2 may be recessed toward the substrate 101 relative to the central region.

In this embodiment, the first source/drain regions 150A may have recess portions R1 in side regions thereof located on both ends of the first contact structure 180A in the second direction (e.g., Y direction). The second source/drain regions 150B may have recess portions R2 in side regions thereof that are not adjacent to the first source/drain regions 150A, respectively.

Referring to FIG. 3A, the recess portions R1 are formed in the left side area of the left first source/drain region 150A and the right side area of the right first source/drain region 150A, respectively. In addition, the recess portions R2 may be formed in the left side area of the left second source/drain region 150B and the right side area of the right second source/drain region 150B, respectively.

The first and second source/drain regions 150A and 150B employed in this embodiment have recess portions R1 and R2 only in one side region, respectively, and may have cross sections, which are taken in the second direction (e.g., Y direction), having an asymmetric structure with respect to a vertical line passing through a center of the first and second source/drain regions 150A and 150B in the second direction (e.g., Y direction) as illustrated in FIG. 3A.

In the respective first and second source/drain regions 150A and 150B, the recess portions R1 and R2 have a bottom surface lower than an upper surface of the central region. The recess portions R1 and R2 may have a structure obtained through an additional etching process on the side regions of the source/drain regions 150. These recess portions R1 and R2 may have a bottom surface, and a sidewall connected to the bottom surface and the upper surface of the central region. In some embodiments, the recess portions R1 and R2 may have an inwardly angled portion between the bottom surface and the sidewall.

Referring to FIG. 2A, the first contact structure 180A may have a contact with a central region of the first source/drain region 150A at a first level L1. Referring to FIG. 2B, the first contact structure 180A may have an extended portion 180E1 extending to a second level L2 lower than the first level L1, along the recess portion R1 of the first source/drain region 150A. For example, the level L2 of the bottom surface may be located 5 nm to 20 nm lower than the level L1 of the upper surface of the central region.

Figure 4:
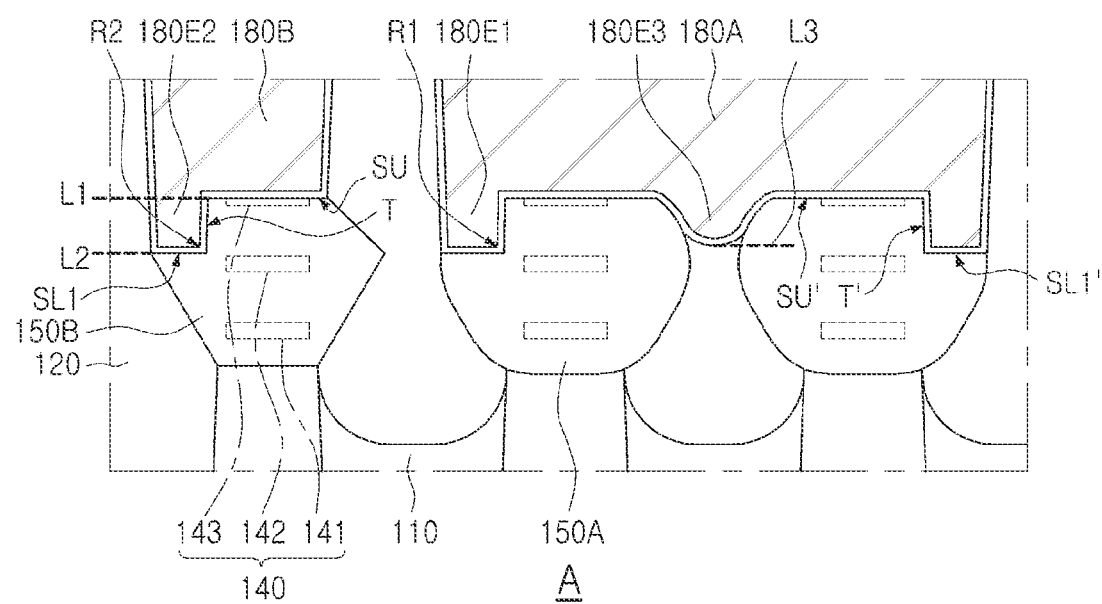
FIG. 4 is an enlarged view of a portion "A" of the semiconductor device of FIG. 3A.

FIG. 4 is an enlarged view illustrating portion "A" of the semiconductor device of FIG. 3A.

Referring to FIG. 4 along with FIG. 3A, similar to the above-described first contact structure 180A, the second contact structures 180B may have extended portions 180E2 extending along the recess portions R2 of the second source/drain regions 150B.

In this embodiment, an upper surface of the central region of the contact region may be at, for example, the first level L1, and the upper surface of the central region may be positioned to be lower than the third channel layer 143 or to overlap the third channel layer 143 in a horizontal direction (e.g., X direction). The bottom levels of the recess portions R1 and R2 of the contact regions, for example, the second level L2 may correspond to the upper surface of the second channel layer 142 or may overlap the third channel layer 143 in the horizontal direction (e.g., X direction). As used herein, "an element A overlapping an element B in a direction W" (or similar language) means that at least one line can be drawn that extends in the direction W and intersects both the elements A and B.

By the extended portions 180E1 and 180E2 of the first and second contact structures 180A and 180B, up to portions of the side surfaces of the first and second source/drain regions 150A and 150B may be wrapped, and thus, contact resistance may be lowered by increasing the contact area. For example, the extended portions 180E1 and 180E2 of the first and second contact structures 180A and 180B may have a width of 5 nm to 20 nm in the second direction.

Still referring to FIG. 4, an upper surface of the second source/drain region 150B may include a stepped surface including first lower step SL1, an upper step SU, and a transition T connecting the first lower step SL1 and the upper step SU. An upper surface of the first source/drain region 150A may include a stepped surface including a first lower step SL1', an upper step SU' and a transition T' connecting the first lower step SL1' and the upper step SU'. The first lower step SL1 of the second source/drain region 150B may be adjacent one end of opposing ends of the second source/drain region 150B in the second direction (e.g., Y direction), and the first lower step SL1' of the first source/drain region 150A may be adjacent one end of opposing ends of the first source/drain region 150A in the second direction (e.g., Y direction) as illustrated. The first contact structure 180A may contact the stepped surface of the first source/drain region 150A, and the second contact structure 180B contacts the stepped surface of the second source/drain region 150B. In some embodiments, the first contact structure 180A may contact an entirety of the first lower step SL1', and the second contact structure 180B may contact an entirety of the first lower step SL1 as illustrated. In some embodiments, the first lower steps SL1 and SL1' may be flat and may be parallel to an upper surface of the substrate (e.g., 101 in FIG. 3A). The upper steps SU and SU' may be flat and may be parallel to the first lower steps SL1 and SL1'. In some embodiments, the first lower steps SL1 and SL1' and the upper steps SU and SU' may be slightly slanted with respect to the upper surface of the substrate (e.g., 101 in FIG. 3A).

The first and second source/drain regions 150A and 150B may respectively include a first epitaxial layer 151 grown from the first and second active fins 105A and 105B, a second epitaxial layer 152 disposed on the first epitaxial layer 151, and a third epitaxial layer 153 disposed on the second epitaxial layer 152.

The first to third epitaxial layers 151, 152, and 153 may be semiconductor layers having different compositions and/or may include impurities of different types and/or concentrations. The first epitaxial layer 151 may effectively suppress a short channel effect caused by diffusion of impurities. For example, the first epitaxial layer 151 may have an impurity concentration lower than that of the second epitaxial layer 152. The first epitaxial layer 151 may be formed on the respective sides of the first to third channel layers 141, 142 and 143 of the channel structure 140 and in the lower end portions of the first and second source/drain regions 150A and 150B, and may be disposed on the active fins 105A and 105B.

The second epitaxial layer 152 is a low resistance region and may provide a contact region with the first and second contact structures 180A and 180B. All of the central regions of the first and second source/drain regions 150A and 150B as well as the recess portions R1 and R2 thereof may be provided as the second epitaxial layers 152 to be connected to the first and second contact structures 180A and 180B.

The third epitaxial layer 153 may be disposed on a region of the second epitaxial layer 152 excluding the contact region, and may be provided as a cap layer protecting the source/drain regions 150A and 150B in a subsequent process. For example, in the case of the second source/drain region 150B, the second epitaxial layer 152 may include silicon germanium (SiGe), and the third epitaxial layer 153 may be formed of silicon (Si) or may include SiGe having a germanium content less than the germanium content of the second epitaxial layer 152.

In this embodiment, the first contact structure 180A has an extended portion 180E3 extending downwardly between two adjacent first source/drain regions 150A. A portion of an interlayer insulating layer 120 between the first source/drain regions 150A may be etched in the process of forming a contact hole, and in this etched region (this is also referred to as a "field recess"), the extended portion 180E3 of the first contact structure 180A may be formed.

When the extended portion 180E3 is formed relatively deep, performance of the device may be degraded due to a non-required capacitance component. To reduce or prevent such performance degradation, the level L3 of the extended portion 180E3 may be positioned higher than a lowest point of the first and second source/drain regions 150A and 150B. In this embodiment, the level L3 of the extended portion 180E3 may be positioned higher than middle portions (e.g., a portion including centers) of the first and second source/drain regions 150A and 150B in a vertical direction (e.g., Z direction). For example, the level L3 of the extended portion 180E3 may be positioned to substantially overlap the second channel layer 142 in a direction (e.g., X direction) that is parallel to the upper surface of the substrate 101. In some embodiments, a lowermost end of the extended portion 180E3 may be higher than the second channel layer 142 as illustrated in FIG. 4, or the lowermost end of the extended portion 180E3 may overlap the second channel layer 142 in the first direction (e.g., X direction)

Figure 10A:
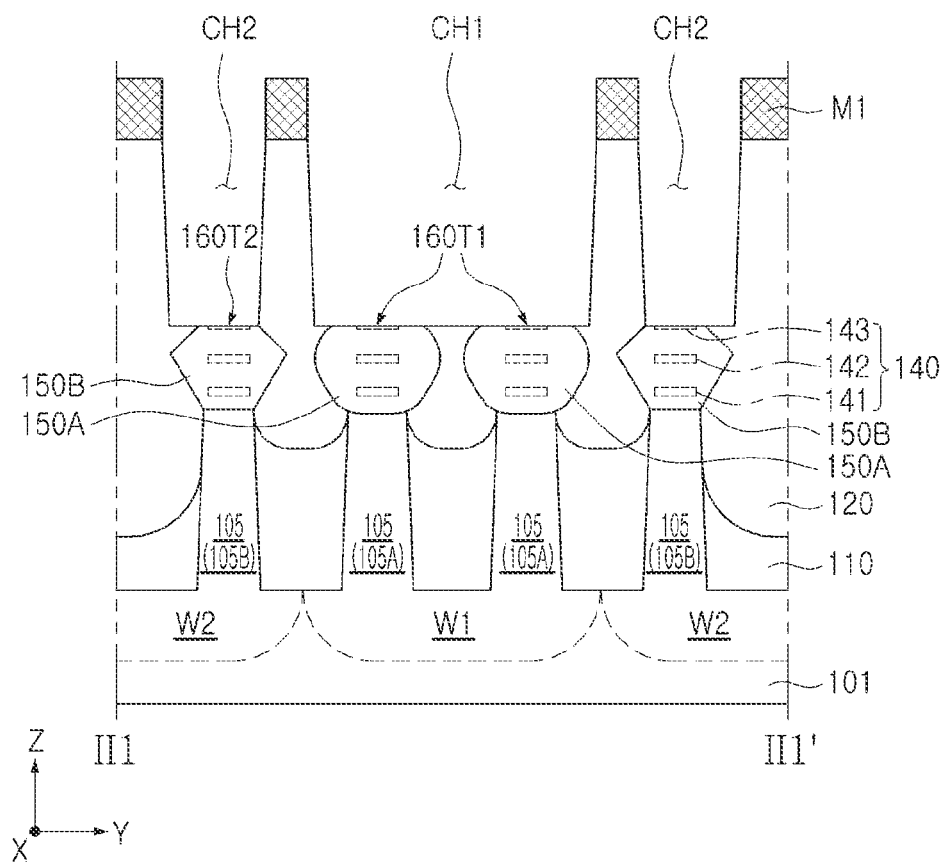
FIGS. 10A to 10D are cross-sectional views illustrating a method of manufacturing a semiconductor device according to an example embodiment of the present inventive concept.
Figure 10B:
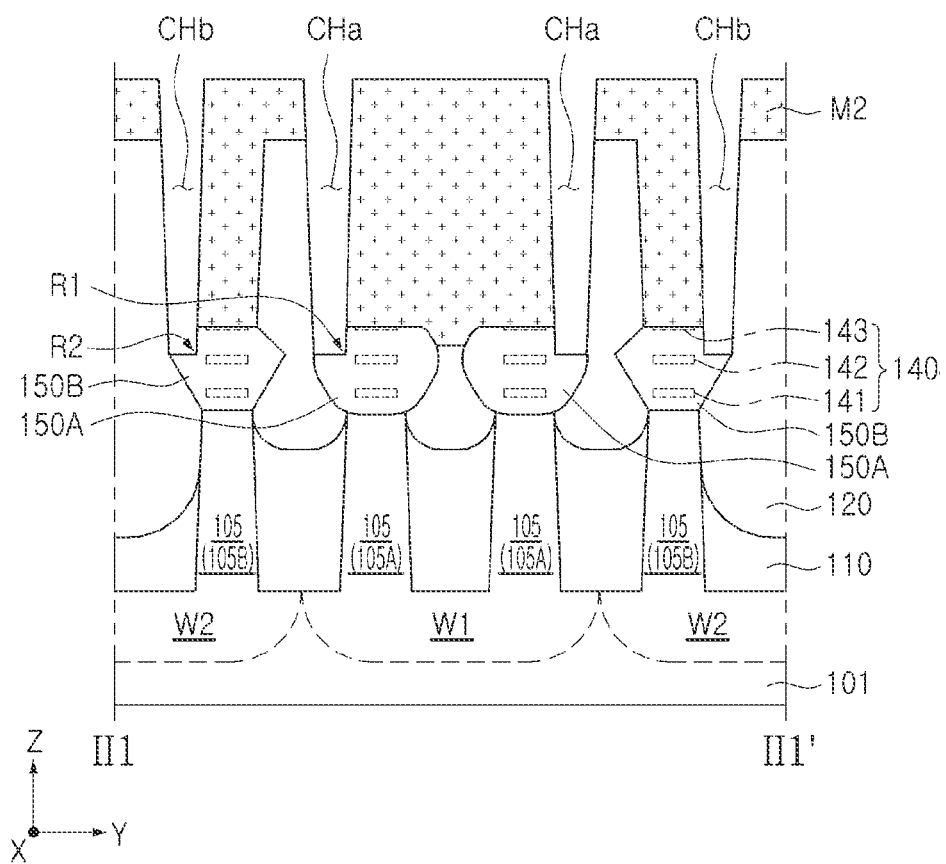
Figure 10C:
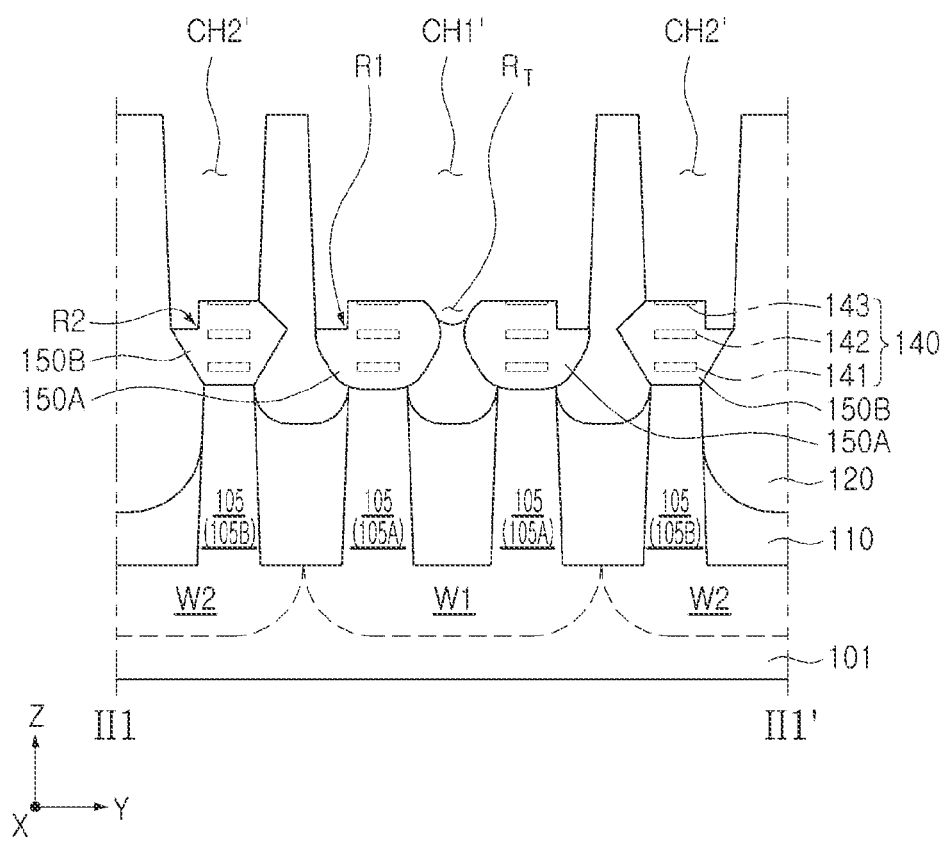

The recess portions R1 and R2 employed in this embodiment may also be formed by forming a contact hole up to the center region level L1 of the contact region (see FIG. 10A) and then by a selective etching process using additional photoresist (see FIGS. 10B and 10C). Since overetching of a portion (even a portion of the device isolation film 110) of the interlayer insulating layer 120 may be prevented, a depth of the extended portion 180E3 extended between the first source/drain regions 150A of the first contact structure 180A may be significantly reduced.

In this embodiment, the first to third channel layers 141, 142, and 143 may include a semiconductor material capable of providing a channel region. For example, the first to third channel layers 141, 142, and 143 may include at least one of silicon (Si), silicon germanium (SiGe), and germanium (Ge). The first to third channel layers 141, 142, and 143 may be formed of the same material as the substrate 101, for example. In this embodiment, three channel layers 141, 142, and 143 are illustrated, but the number and shape of the channel layers 141, 142 and 143 may be variously changed.

The gate dielectric layer 162 may be disposed between the active region 105 and the gate electrode 165 and between the channel structure 140 and the gate electrode 165, and may cover at least a portion of the surfaces of the gate electrode 165. In some embodiments, the gate dielectric layer 162 may be disposed to surround all surfaces of the gate electrode 165 except for the top surface.

The gate dielectric layer 162 may extend between the gate electrode 165 and the gate spacer 164, but the configuration is not limited thereto. For example, the gate dielectric layer 162 may include oxide, nitride, and/or a high-k material. The high-k material refers to a dielectric material having a dielectric constant higher than that of a silicon oxide film ($SiO_2$). The high-k material may be any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may be disposed on the active region 105 to fill the gaps between the plurality of channel layers 141, 142, and 143 and extend upwardly from the channel structure 140. The gate electrode 165 may be spaced apart from the plurality of channel layers 141, 142, and 143 by the gate dielectric layer 162. The gate electrode 165 may include a conductive material, for example, a metal nitride such as a titanium nitride film (TiN), a tantalum nitride film (TaN), or a tungsten nitride film (WN), and/or a metal such as aluminum (Al), tungsten (W), or molybdenum (Mo), or a semiconductor material such as doped polysilicon. The gate electrode 165 may also be formed of two or more multiple layers. The gate electrode 165 may be separated and disposed between at least some adjacent transistors by a separate separation portion according to the configuration of the semiconductor device 100.

The gate spacers 164 may be disposed on both sides of the gate electrode 165. The gate spacers 164 may electrically insulate the source/drain regions 150 from the gate electrodes 165. In some embodiments, the gate spacers 164 may also be formed of a multilayer structure. For example, the gate spacers 164 may be formed of oxide, nitride, and/or oxynitride, and in detail, may be formed of a low-k film.

The gate capping layer 166 may be disposed on the gate electrode 165, and the lower surface and side surfaces thereof may be surrounded by the gate electrode 165 and the gate spacers 164, respectively.

Inner spacer layers 130 may be disposed in parallel with the gate electrode 165, between the channel structures 140. Below the third channel layer 143, the gate electrode 165 may be separated from the source/drain regions 150 by the internal spacer layers 130 and may be electrically insulated therefrom. The inner spacer layers 130 may have a shape in which side surfaces facing the gate electrode 165 are convexly rounded inwardly toward the gate electrode 165, but the shape thereof is not limited thereto. The inner spacer layers 130 may be formed of, for example, oxide, nitride, and/or oxynitride, and in some embodiments, may be formed of a low-k film.

As described above, the first and second contact structures 180A and 180B penetrate through the interlayer insulating layer 120, and are connected to the first and second source/drain regions 150A and 150B, respectively, to apply an electric signal to the source/drain regions 150A and 150B. The first and second contact structures 180A and 180B may be disposed on the first and second source/drain regions 150A and 150B as illustrated in FIG. 1. In some embodiments, the first and second contact structures 180A and 180B may be disposed to have a greater length than that of the first and second source/drain regions 150A and 150B in the second direction. The first and second contact structures 180A and 180B may have inclined side surfaces in which the width of the lower portion becomes narrower than the width of the upper portion according to the aspect ratio, but the configuration thereof is not limited thereto.

The first and second contact structures 180A and 180B may include a conductive barrier 181 and a contact plug 185. The conductive barrier 181 may cover side and lower surfaces of the contact plug 185. For example, the conductive barrier 181 may include Ta, TaN, Mn, MnN, WN, Ti, and/or TiN. The contact plug 185 may include tungsten (W), cobalt (Co), titanium (Ti), aluminum (Al), molybdenum (Mo), alloys thereof, or combinations thereof.

The interlayer insulating layer 120 may be disposed to cover the first and second source/drain regions 150A and 150B and the gate structures 160, and may be disposed to cover the device isolation film 110 in a region not illustrated. The interlayer insulating layer 120 may include at least one of, for example, oxide, nitride, and oxynitride, and may include a low dielectric constant material.

Figure 5:
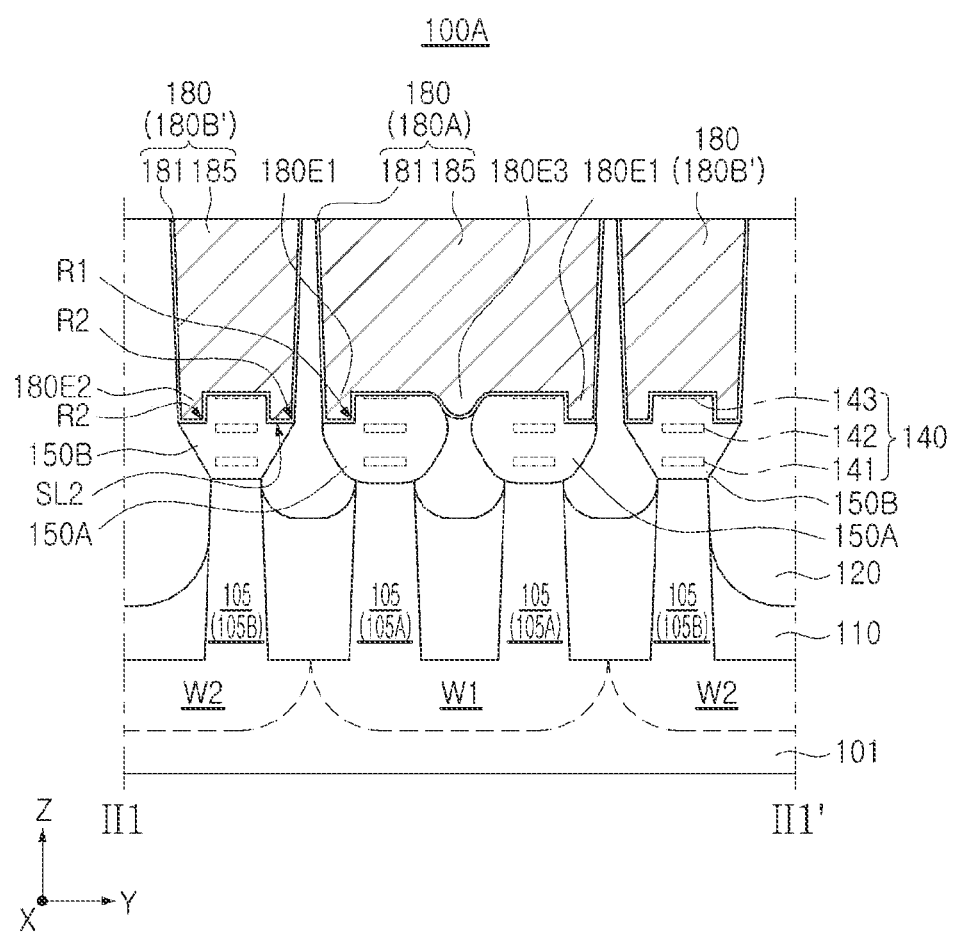
FIG. 5 is a cross-sectional view illustrating a semiconductor device according to an example embodiment of the present inventive concept.

FIG. 5 is a cross-sectional view illustrating a semiconductor device according to an example embodiment of the present inventive concept.

Referring to FIG. 5, a semiconductor device 100A according to an example embodiment may be understood to be similar to that of the example embodiment described in FIGS. 1 to 4, except that recess portions R2 are formed in both side regions of some source/drain regions 150B. In addition, components of this embodiment may be understood with reference to the descriptions of the same or similar components of the embodiments illustrated in FIGS. 1 to 4 unless otherwise specified. The stepped surface of the second source/drain region 150B may further include a second lower step SL2 adjacent one of opposing ends of the second source/drain region 150B as illustrated in FIG. 5.

The first and second source/drain regions 150A and 150B may have the recess portions R1 and R2, respectively. Similar to the previous embodiment, the first source/drain regions 150A may have recess portions R2 in side regions located in both ends of the first contact structure 180A in the second direction (e.g., Y direction). In detail, the recess portions R2 may be formed in a left side area of the left first source/drain region 150A and a right side area of the right first source/drain region 150A, respectively. The first contact structure 180A may have extended portions 180E2 extended to the recess portions R2 of the left and right side areas.

On the other hand, unlike the previous embodiment, the second source/drain regions 150B may have the recess portions R1 on both sides in the second direction (e.g., Y direction). As illustrated in FIG. 5, the second source/drain regions 150B may have first and second side regions, and may have the recess portions R1 in the first and second side regions, respectively. After the contact hole is formed, the recess portions R1 may be formed by applying a photoresist process, for example, twice, to portions of the second source/drain regions 150B exposed on both sides of the contact hole, respectively. The second contact structure 180B' may be in contact with the central region of the second source/drain regions 150B, and may have extended portions 180E1 extended to the recess portions R1 of the first and second side regions.

In this manner, by exposing the side regions of the first and second source/drain regions 150A and 150B using a separate photoresist process, the depth of an extended portion 180E3 of the first contact structure 180A, extending between the first source/drain regions 150A may be significantly reduced, and the second contact structure 180B may be formed in a structure that wraps up to both sides of each of the second source/drain regions 150B. Accordingly, in the semiconductor device 100A according to this embodiment, the contact structures 180A and 180B may be formed to have excellent contact resistance while reducing or preventing performance degradation due to non-required capacitance components.

Figure 6A:
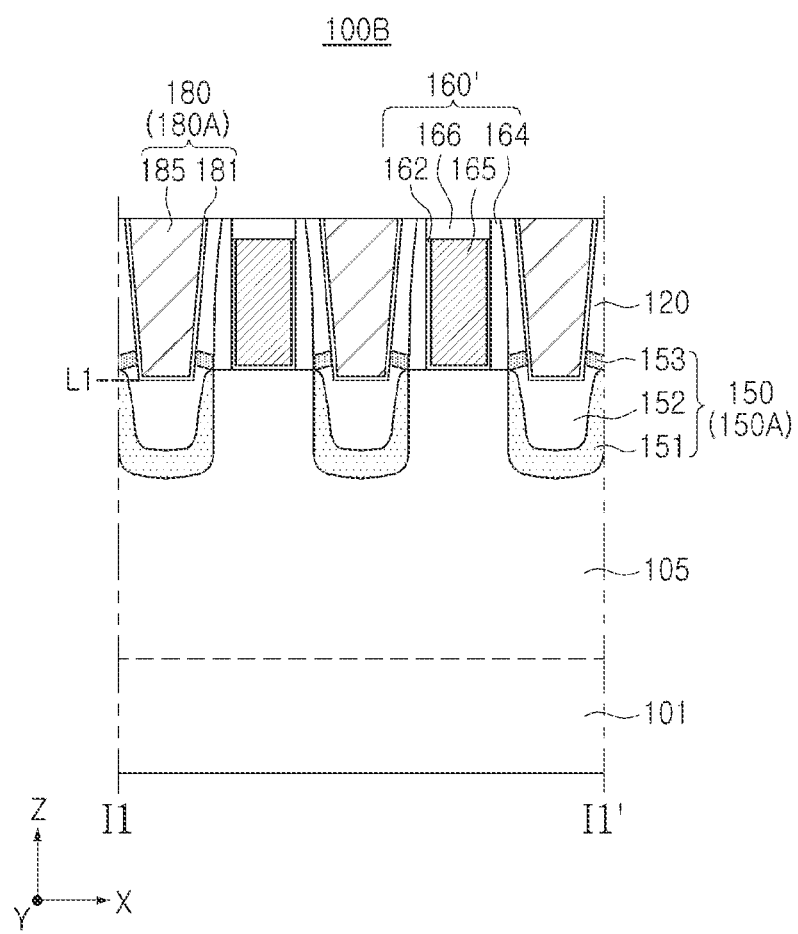
FIGS. 6A and 6B are cross-sectional views illustrating a semiconductor device according to an example embodiment of the present inventive concept.
Figure 6B:
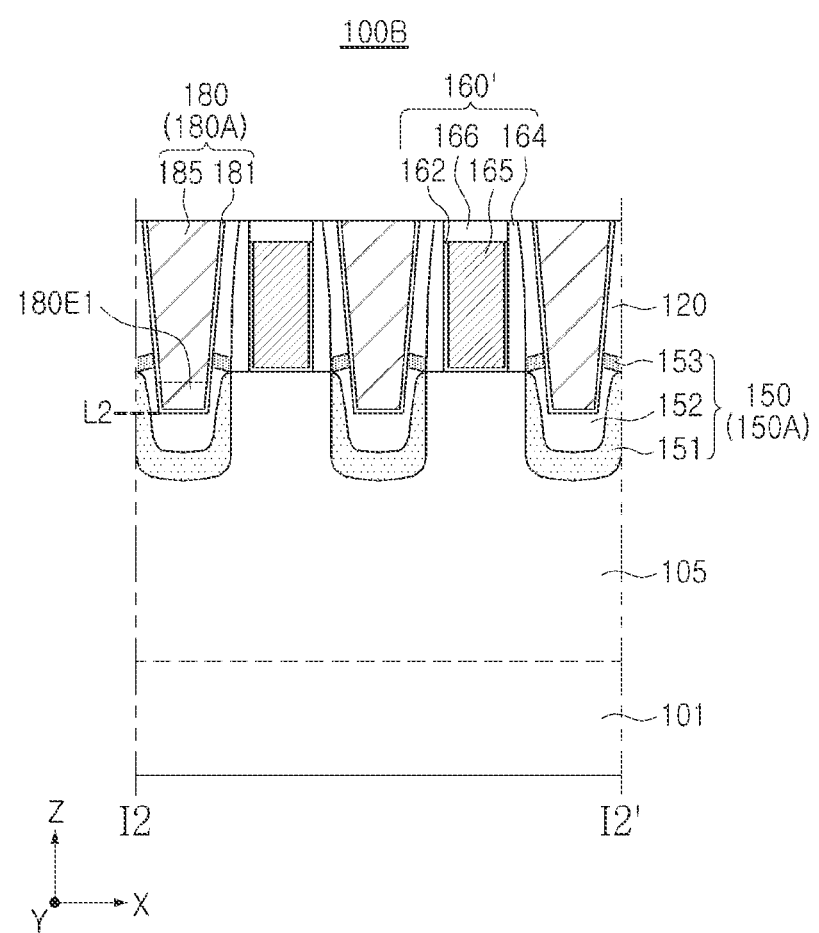
Figure 7:
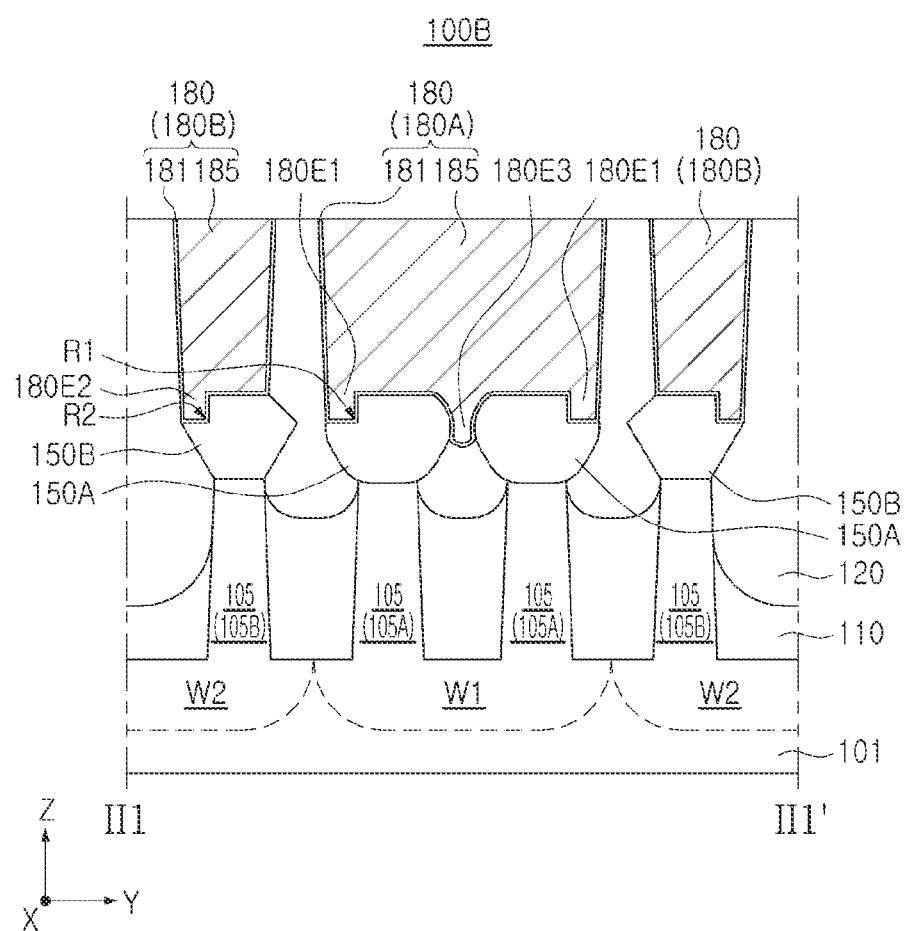
FIG. 7 is a cross-sectional view illustrating a semiconductor device according to an example embodiment of the present inventive concept.

FIGS. 6A and 6B are cross-sectional views illustrating a semiconductor device according to an example embodiment of the present inventive concept, and FIG. 7 is a cross-sectional view illustrating a semiconductor device according to an example embodiment of the present inventive concept.

In this case, it can be understood that FIGS. 5A and 6B correspond to the cross-sectional views of the semiconductor device taken along lines I1-I1' and I2-I2' in FIG. 1, and FIG. 7 corresponds to the cross-sectional view of the semiconductor device taken along line II-II1' in FIG. 1.

Referring to FIGS. 6A, 6B and 7, a semiconductor device 100B according to an example embodiment may be understood to be similar to the example embodiment illustrated in FIGS. 1 to 4, except that the structures of a gate structure 160' and an active region are different therefrom. In addition, components of this embodiment may be understood with reference to the descriptions of the same or similar components of the example embodiment illustrated in FIGS. 1 to 4 unless otherwise specified.

The semiconductor device 100B according to an example embodiment may include first and second active fins 105A and 105B extending in a first direction (e.g., X direction) and arranged to be spaced apart from each other in a second direction (e.g., direction). The gate structure 160' employed in this embodiment extends in the second direction while traversing the first and second active fins 105A and 105B. In detail, the gate structure 160' may include a gate electrode 165 extending in the second direction to intersect the active fin 105, and a gate dielectric layer 162 disposed between the gate electrode 165 and the active fin 105. Since the semiconductor device 100B according to this embodiment does not include channel layers (e.g., 141, 142 and 143 in FIGS. 2A and 2B), in the gate structure 160', a structure related to the channel structure (140 in FIG. 2A) may be omitted or changed. Also, the first and second source/drain regions 150A and 150B may include epitaxial layers grown from recessed regions of the first and second active fins 105A and 105B, respectively.

The first and second source/drain regions 150A and 150B have contact regions in contact with the first and second contact structures 180A and 180B, respectively. The contact regions of the first and second source/drain regions 150A and 150B may each have first and second side regions spaced apart from each other in the second direction (e.g., Y direction), and a central region between the first and second side regions. At least one of the first and second side regions may have a portion (R1, R2) recessed toward the substrate 101 relative to the central region.

Referring to FIG. 7, recess portions R1 may be formed in the left side area of the left first source/drain region 150A and in the right side area of the right first source/drain region 150A, respectively. In addition, recess portions R2 may be formed in the left side area of the left second source/drain region 150B and in the right side area of the right second source/drain region 150B, respectively. The recess portions R1 and R2 employed in this embodiment are provided only in one side region of each of the first and second source/drain regions 150A and 150B, and as a result, the first and second source/drain regions 150A and 150B may each have a asymmetric structure in cross section taken in the second direction (e.g., Y direction). In some embodiments, the cross-section of each of the first and second source/drain regions 150A and 150B, which is taken along the second direction, may be asymmetric with respect to a vertical line (e.g., a line extending in the Z direction) that passes through a center of each of the first and second source/drain regions 150A and 150B in the second direction as illustrated in FIG. 7.

The first and second contact structures 180A and 180B have extended portions 180E1 and 180E2 in contact with the recess portions R1 and R2, and thus, may wrap up to portions of side surfaces of the first and second source/drain regions 150A and 150B. As a result, the contact resistance may be lowered by increasing the contact area.

The recessed structure according to this embodiment may be similarly applied to a structure in which an epitaxial layer in a source/drain region is grown from the plurality of active fins to be merged with each other.

Figure 8:
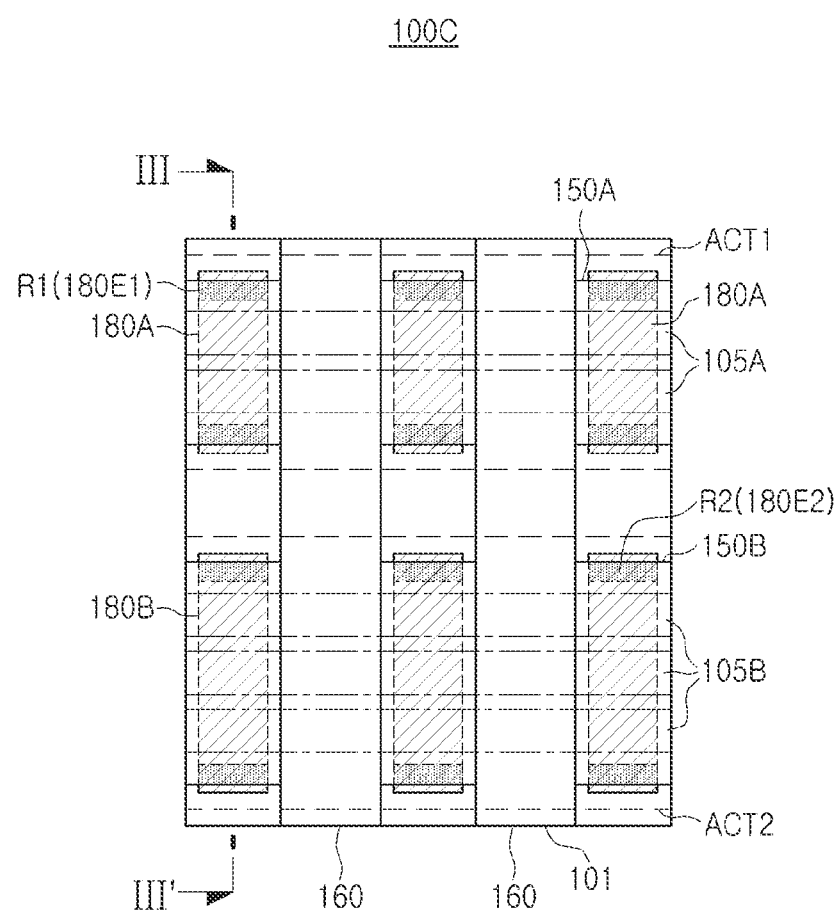
FIG. 8 is a plan view illustrating a semiconductor device according to an example embodiment of the present inventive concept.
Figure 9:
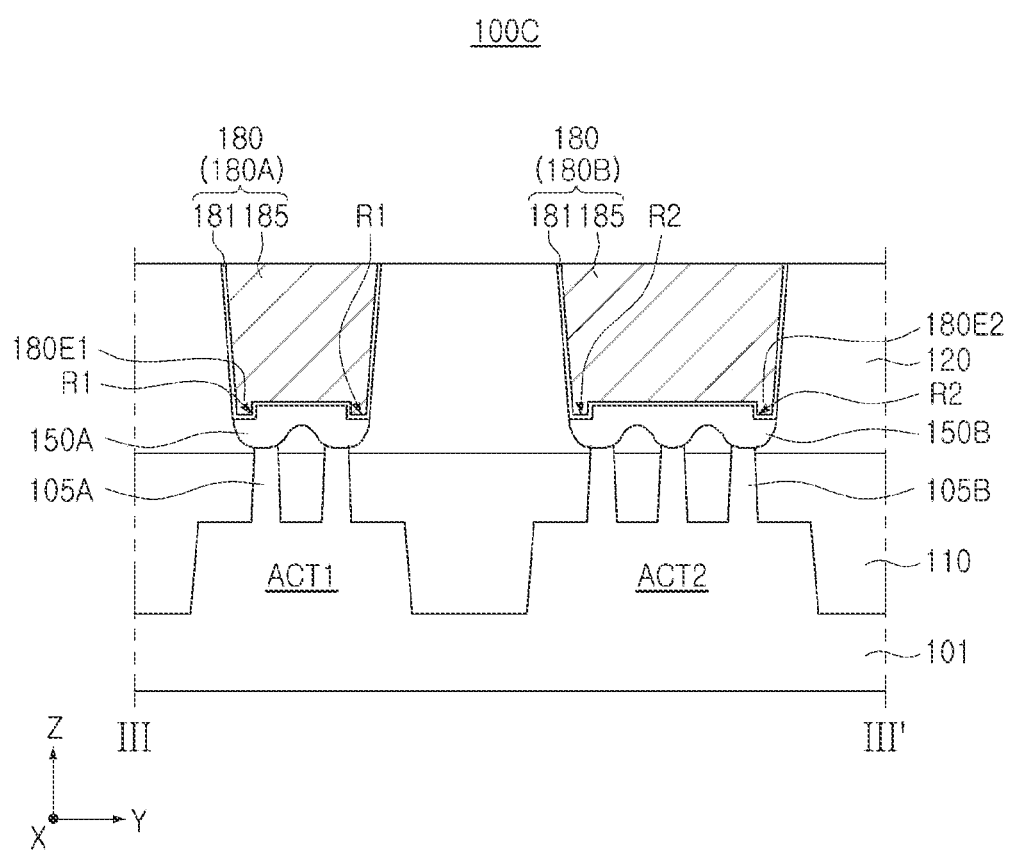
FIG. 9 is a cross-sectional view of the semiconductor device of FIG. 8, taken along line III-III'.

FIG. 8 is a plan view illustrating a semiconductor device according to an example embodiment of the present inventive concept, and FIG. 9 is a cross-sectional view of the semiconductor device of FIG. 8 taken along line III-III'.

Referring to FIGS. 8 and 9, a semiconductor device 100C according to an example embodiment may include first and second active regions ACT1 and ACT2 and device isolation films 110 disposed on a substrate 101.

In some embodiments, the substrate 101 may include a semiconductor such as Si or Ge, or a compound semiconductor such as SiGe, SiC, GaAs, InAs, or InP. The first and second active regions ACT1 and ACT2 may be a well doped with impurities or a structure including impurities. In this embodiment, the first active region ACT1 may be an n-type well for a PMOS transistor, and the second active region ACT2 may be a p-type well for an NMOS transistor, but the present inventive concept is not limited thereto.

A first active fin 105A may be disposed on an upper surface of the first active region ACT1, and a second active fin 105B may be disposed on an upper surface of the second active region ACT2. The first and second active fins 105A and 105B have a structure protruding upwardly (e.g., Z direction) from the upper surfaces of the first and second active regions ACT1 and ACT2, respectively. In this embodiment, the first and second active fins 105A and 105B are illustrated as two or three, respectively, but configurations are not limited thereto. For example, in other embodiments, the first and second active fins 105A and 105B may be provided alone or in plural, for example, more than three.

As illustrated in FIG. 8, the first active fin 105A and the second active fin 105B may extend in parallel in the first direction (e.g., X direction) in the first active region ACT1 and the second active region ACT2, respectively. The first active fin 105A and the second active fin 105B may be provided as active regions of each transistor.

The device isolation film 110 defines the first and second active regions ACT1 and ACT2. The device isolation film 110 may include silicon oxide and/or a silicon oxide-based insulating material. The device isolation film 110 may include a first isolation region defining the first and second active regions ACT1 and ACT2, and a second isolation region defining the first and second active fins 105A and 105B. The first isolation region has a deeper bottom surface than that of the second isolation region. The first isolation region may be referred to as deep trench isolation (DTI), and the second isolation region may be referred to as shallow trench isolation (STI). Portions of the first and second active fins 105A and 105B may protrude from the upper surface of the device isolation film 110.

The semiconductor device 100C according to this embodiment may include a gate structure 160. As illustrated in FIG. 8, two gate structures 160 may extend in a second direction (e.g., Y direction) intersecting the first direction (e.g., X direction). The detailed structure of the gate structure 160 may be understood with reference to the gate structure 160' illustrated in FIGS. 6A and 6B.

The first and second source/drain regions 150A and 150B may be formed in partial regions of the first and second active fins 105A and 105B located on both sides of the gate structure 160, respectively. In this embodiment, the first and second source/drain regions 150A and 150B may be formed by forming recesses in some regions of the first and second active fins 105A and 105B and by selective epitaxial growth (SEG) in the recesses, and thus, may have upper surfaces having a higher level than that of the first and second active fins 105A and 105B. These first and second source/drain regions 150A and 150B are also referred to as raised source/drain (RSD). For example, the first and second source/drain regions 150A and 150B may be formed of Si, SiGe or Ge as described above and may have one of N-type or P-type conductivity.

The first and second source/drain regions 150A and 150B employed in this embodiment may have epitaxial structures merged with each other by being grown from the plurality of first and second active fins 105A and 105B, respectively.

In the semiconductor device 100C according to this embodiment, an interlayer insulating layer 120 may be disposed on the device isolation film 110. The interlayer insulating layer 120 may be disposed around the gate structure 160 and the first and second source/drain regions 150A and 150B. For example, the interlayer insulating layer 120 may be formed of Tetra Ethyl Ortho Silicate (TEOS), Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ), or combinations thereof. The interlayer insulating layer 120 may be formed using a chemical vapor deposition (CVD) or spin coating process.

The first and second contact structures 180A and 180B may be formed by penetrating through the interlayer insulating layer 120 and may be connected to the first and second source/drain regions 150A and 150B, respectively.

In this embodiment, the first source/drain region 150A may include one epitaxial layer formed over the plurality of first active fins 105A, and similarly, the second source/drain region 150B may have one epitaxial structure formed over the plurality of second active fins 105B.

In this embodiment, the first source/drain regions 150A may have recess portions R1 recessed in side regions located on both ends of the first contact structure 180A in the second direction (e.g., Y direction). Similar to the first source/drain regions 150A, the second source/drain regions 150B may also have recess portions R2 recessed in side regions located on both ends of the second contact structure 180B in the second direction.

Since the first and second contact structures 180A and 180B have extended portions 180E1 and 180E2 in contact with the recess portions R1 and R2, and thus, may wrap up to portions of side surfaces of the first and second source/drain regions 150A and 150B. As a result, the contact resistance may be lowered by increasing the contact area.

FIGS. 10A to 10D are cross-sectional views illustrating methods of manufacturing a semiconductor device according to an example embodiment of the present inventive concept.

The manufacturing process according to the embodiment is a manufacturing process for the semiconductor device illustrated in FIGS. 1 to 4 and represents a process of forming the contact structure 180. The process of forming the contact structure 180 may be performed after forming an epitaxial layer for the source/drain regions 150 and performing a replacement process for forming the gate structure 160.

Referring to FIG. 10A, first and second contact holes CH1 and CH2 connected to the first and second source/drain regions 150A and 150B, respectively, may be formed in the interlayer insulating layer 120.

The first and second contact holes CH1 and CH2 may be formed by an etching process using a mask pattern M1. The first and second contact holes CH1 and CH2 are formed in such a manner that the first and second source/drain regions 150A and 150B are exposed, and may be formed to have an appropriate height (e.g., "L1" in FIGS. 2A and 4) such that the interlayer insulating layer 120 is not overly etched.

In this etching process, the first and second source/drain regions 150A and 150B may have etched upper surfaces 160T1 and 160T2. By the etched upper surfaces 160T1 and 160T2, the third epitaxial layer ("153" in FIGS. 2A and 2B) corresponding to a protective cap layer may be partially removed, thereby exposing the second epitaxial layer ("152" in FIGS. 2A and 2B) having relatively low contact resistance. In this etching process, a portion of the interlayer insulating layer 120 positioned between the first source/drain regions 150A may not be severely etched. In some embodiments, the portion of the interlayer insulating layer 120 between the first source/drain regions 150A may not be recessed as illustrated in FIG. 10A.

Next, referring to FIG. 10B, a photoresist pattern M2 including first and second side holes CHa and CHb in some side regions of the first and second source/drain regions 150A and 150B may be formed, and a selective etching process may be performed using the photoresist pattern M2. Subsequently, referring to FIG. 10C, the photoresist pattern M2 may be removed.

The first side holes CHa are formed to expose side regions located on both sides of the two first source/drain regions 150A in a second direction, and the second side holes CHb may be formed to expose side regions of the second source/drain regions 150B, which are not adjacent to the first source/drain regions 150A.

By this etching process, the first and second source/drain regions 150A and 150B may have the recess portions R1 and R2 only in one side regions, respectively. The first and second source/drain regions 150A and 150B formed as described above may have a structure in which a cross-section in the second direction (e.g., Y direction) is asymmetric with respect to a vertical line that extends in the Z direction and passes through a center of one of the first and second source/drain regions 150A and 150B in the second direction.

In the respective first and second source/drain regions 150A and 150B, the recess portions R1 and R2 have a bottom surface lower than an upper surface of the central region. The recess portions R1 and R2 may have a structure obtained through an additional etching process on the side regions of the source/drain regions 150.

In the process of removing the photoresist pattern M2, a portion of the interlayer insulating layer 120 between the first source/drain regions 150A may be additionally etched, and a recess $R_T$ may be formed, but that portion is protected by the photoresist pattern M2 during the process of forming the recess portions R1 and R2 in the side regions, and thus, over-etching of that portion of the interlayer insulating layer 120 between the first source/drain regions 150A may be significantly reduced.

Figure 10D:
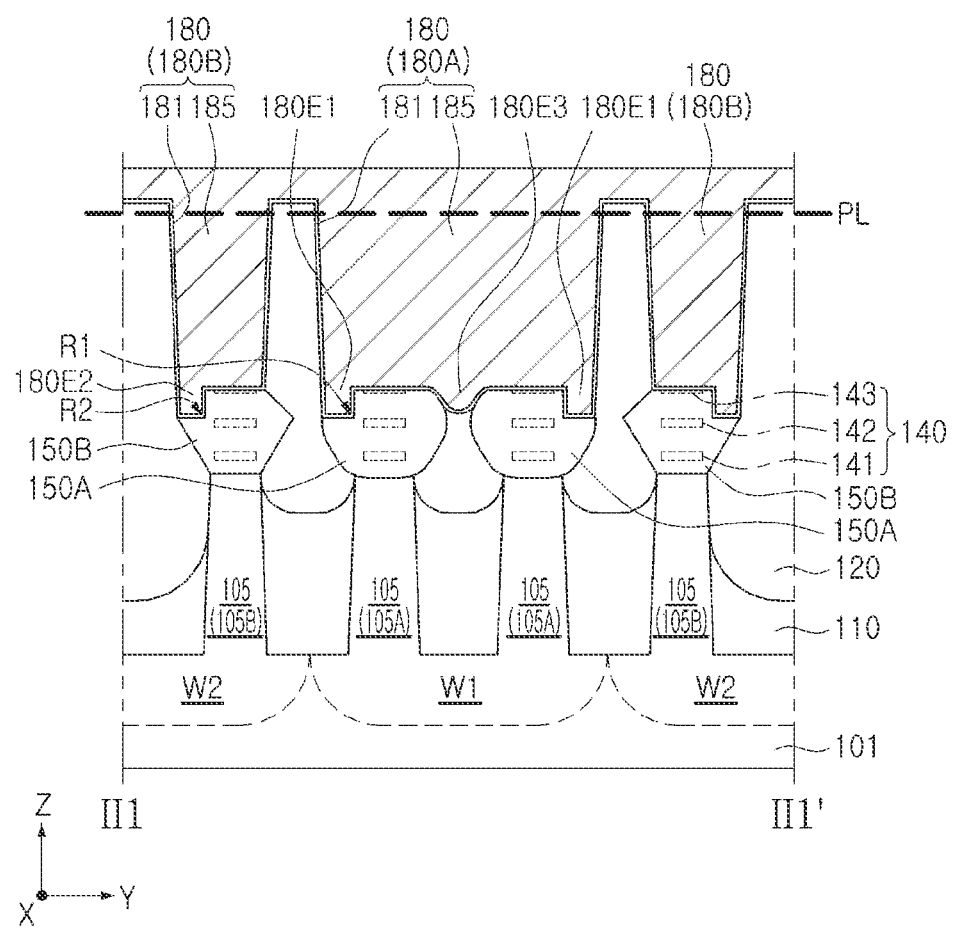

Next, referring to FIG. 10D, the first and second contact structures 180A and 180B connected to the first and second source/drain regions 150A and 150B, respectively, may be formed.

In this process, a conductive barrier 181 and a contact plug 185 may be sequentially formed, and portions of the conductive barrier 181 and the contact plug 185 located on the upper surface of the interlayer insulating layer 120 may be removed using the process of flattening to a predetermined height (PL), thereby forming the first and second contact structures 180A and 180B.

The first and second contact structures 180A and 180B formed in this process may have portions extending to the recess portions R1 and R2 of the first and second source/drain regions 150A and 150B. The first and second contact structures 180A and 180B may wrap up to portions of the side surfaces of the first and second source/drain regions 150A and 150B by the extended portions 180E1 and 180E2, thereby having a sufficient contact area.

As described above, by forming the recess portions in the side regions of the first and second source/drain regions 150A and 150B using a separate photoresist process, while significantly reducing the depth of the extended portion 180E3 of the first contact structure 180A extending between the first source/drain regions 180A, the second contact structure 180B may be formed in a structure wrapping up to both sides of the respective second source/drain regions 150A.

Accordingly, in the semiconductor device 100A according to this embodiment, the contact structures 180A and 180B having excellent contact resistance may be formed, while reducing or preventing performance degradation due to non-required capacitance components.

As set forth above, according to example embodiments, by forming additional recesses in side regions for source/drain regions, the contact area may be increased, thereby reducing resistance loss. In addition, deterioration of performance may be reduced or prevented by reducing or preventing excessive removal of a portion of an insulating layer between adjacent source/drain regions during a contact hole formation process.

While example embodiments have been illustrated and described above, it will be apparent to those skilled in the art that modifications and variations could be made without departing from the scope of the present inventive concept as defined by the appended claims.

What is claimed is:
1. A semiconductor device comprising:
a substrate;
an active region that is on the substrate and extends in a first direction;

a gate structure that traverses the active region and extends in a second direction that is different from the first direction;

a source/drain region on the active region adjacent a side of the gate structure; and a contact structure that is on and contacts the source/drain region, wherein the active region includes first and second active regions that are spaced apart from each other in the second direction, the source/drain region includes first and second source/drain regions that are on the first and second active regions, respectively, and the contact structure is on the first and second source/drain regions, wherein each of the first and second source/drain regions includes a first side region and a second side region spaced apart from each other in the second direction, the second side region of the first source/drain region is adjacent the first side region of the second source/drain region, and the recess comprises a first recess in the first side region of the first source/drain region and a second recess in the second side region of the second source/drain region.

2. The semiconductor device of claim 1, wherein each of the first and second recesses has a depth of 5 nm to 20 nm relative to an upper surface of the central region.

3. The semiconductor device of claim 1, wherein each of the first and second source/drain regions includes a first epitaxial layer contacting the active region, a second epitaxial layer that is on the first epitaxial layer and includes a contact region that is in contact with the contact structure, and a third epitaxial layer on a region of the second epitaxial layer, and the region of the second epitaxial layer is different from the contact region, and the third epitaxial layer includes silicon, or silicon germanium having a germanium content lower than a germanium content of the second epitaxial layer.

4. The semiconductor device of claim 1, wherein the contact structure includes an extended portion extending downwardly between the first and second source/drain regions, and wherein a lowermost end of the extended portion is higher than lowermost ends of the first and second source/drain regions.

5. The semiconductor device of claim 4, wherein the lowermost end of the extended portion is higher than a center of each of the first and second source/drain regions in a vertical direction that is perpendicular to an upper surface of the substrate.

6. A semiconductor device comprising:

a substrate;

an active region on the substrate extending in a first direction;

a gate structure traversing the active region and extending in a second direction that is different from the first direction;

a plurality of channel layers that are spaced apart from each other in a vertical direction that is perpendicular to an upper surface of the substrate and are on the active region;

a source/drain region on the active region adjacent a side of the gate structure; and a contact structure contacting the source/drain region, wherein an upper surface of the source/drain region includes a stepped surface that is contacted by the contact structure and includes a lower step and an upper step, the source/drain region includes opposing ends spaced apart from each other in the second direction, and the lower step is adjacent a first end of the opposing ends of the source/drain region, and wherein the lower step is lower than a lower surface of an uppermost channel layer of the plurality of channel layers.

7. The semiconductor device of claim 6, wherein the lower step is parallel to the upper step.

8. The semiconductor device of claim 6, wherein the lower step is parallel to an upper surface of the substrate.

9. The semiconductor device of claim 6, wherein the contact structure contacts an entirety of the lower step.

10. The semiconductor device of claim 6, wherein the lower step is a first lower step, and the stepped surface of the source/drain region further comprises a second lower step adjacent a second end of the opposing ends of the source/drain region.

11. The semiconductor device of claim 6, wherein the source/drain region contacts the plurality of channel layers, and wherein the upper step is higher than a lower surface of the uppermost channel layer of the plurality of channel layers.

12. The semiconductor device of claim 11, wherein the source/drain region includes a first epitaxial layer contacting the active region, a second epitaxial layer that is on the first epitaxial layer and includes the stepped surface, and a third epitaxial layer on a region of the second epitaxial layer, and the region of the second epitaxial layer does not include the stepped surface, and the lower step is 5 nm to 20 nm lower than the upper step.

13. The semiconductor device of claim 11, wherein the contact structure includes a contact portion contacting the lower step, and a width of the contact portion in the second direction ranges from 5 nm to 20 nm.

14. A semiconductor device comprising:

a substrate;

two first active fins and a second active fin that are on the substrate, extend in a first direction and are spaced apart from each other in a second direction that is different from the first direction;

a gate structure traversing the two first active fins and the second active fin and extending in the second direction;

two first source/drain regions on the two first active fins, respectively, adjacent a side of the gate structure;

a second source/drain region on the second active fin, adjacent the side of the gate structure, wherein a first one of the two first source/drain regions, a second one of the two first source/drain regions, and the second source/drain region are sequentially arranged along the second direction;

an insulating layer on the gate structure and the first and second source/drain regions;

a first contact structure that is in the insulating layer and contacts the two first source/drain regions; and a second contact structure that is in the insulating layer and contacts the second source/drain region, wherein each of the two first source/drain regions includes first and second side regions spaced apart from each other in the second direction, and the first side region of one of the two first source/drain regions is closer to the second source/drain region than the second side region of the one of the two first source/drain regions, and the second side region of the first one of the two first active fins includes a first recess, and the first side region of the second one of the two first active fins includes a second recess, and end portions of the first contact structure in the second direction are in the first and second recesses, respectively.

15. The semiconductor device of claim 14, wherein the second source/drain region includes third and fourth side regions spaced apart from each other in the second direction, the third side region is closer to the second one of the two first active fins than the fourth side region, and the fourth side region includes a third recess, and the second source/drain region has an asymmetric structure in a cross section taken along the second direction.

* * * * *